(12) United States Patent
Ontalus et al.

(10) Patent No.: US 11,588,043 B2
(45) Date of Patent: Feb. 21, 2023

(54) BIPOLAR TRANSISTOR WITH ELEVATED EXTRINSIC BASE AND METHODS TO FORM SAME

(71) Applicant: GLOBALFOUNDRIES U.S. Inc., Santa Clara, CA (US)

(72) Inventors: Viorel C. Ontalus, Hartford, CT (US); Judson R. Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/229,950

(22) Filed: Apr. 14, 2021

(65) Prior Publication Data

US 2022/0336646 A1 Oct. 20, 2022

(51) Int. Cl.
| | |
|---|---|
| *H01L 29/06* | (2006.01) |
| *H01L 29/732* | (2006.01) |
| *H01L 29/66* | (2006.01) |
| *H01L 29/161* | (2006.01) |
| *H01L 29/167* | (2006.01) |
| *H01L 29/10* | (2006.01) |

(52) U.S. Cl.
CPC ...... *H01L 29/7325* (2013.01); *H01L 29/0649* (2013.01); *H01L 29/1004* (2013.01); *H01L 29/161* (2013.01); *H01L 29/167* (2013.01); *H01L 29/66234* (2013.01)

(58) Field of Classification Search
CPC ............. H01L 29/7325; H01L 29/0649; H01L 29/1004; H01L 29/161; H01L 29/167; H01L 29/66234

USPC .......................................................... 257/586
See application file for complete search history.

(56) References Cited

U.S. PATENT DOCUMENTS

| | | | |
|---|---|---|---|
| 5,059,544 A | | 10/1991 | Burghartz et al. |
| 5,258,642 A | * | 11/1993 | Nakamura ........ H01L 21/28525 257/E29.174 |
| 7,005,359 B2 | | 2/2006 | Ahmed et al. |
| 7,892,910 B2 | | 2/2011 | Feilchenfeld et al. |
| 8,946,861 B2 | | 2/2015 | Camillo-Castillo et al. |
| 2003/0201517 A1 | | 10/2003 | Dunn et al. |
| 2013/0228824 A1 | * | 9/2013 | Morishita ........... H01L 27/0262 257/173 |
| 2013/0277804 A1 | * | 10/2013 | Cheng ............... H01L 29/66287 257/586 |
| 2014/0264458 A1 | | 9/2014 | Preisler et al. |
| 2014/0327111 A1 | * | 11/2014 | Camillo-Castillo ........ H01L 29/0649 257/586 |
| 2014/0363930 A1 | * | 12/2014 | Bobde ................ H01L 27/0744 438/133 |
| 2015/0008562 A1 | * | 1/2015 | Harame .................. H01L 29/16 257/586 |

(Continued)

*Primary Examiner* — Sheikh Maruf
(74) *Attorney, Agent, or Firm* — Francois Pagette; Hoffman Warnick LLC

(57) ABSTRACT

Aspects of the disclosure provide a bipolar transistor structure with an elevated extrinsic base, and related methods to form the same. A bipolar transistor according to the disclosure may include a collector on a substrate, and a base film on the collector. The base film includes a crystalline region on the collector and a non-crystalline region adjacent the crystalline region. An emitter is on a first portion of the crystalline region of the base film. An elevated extrinsic base is on a second portion of the crystalline region of the base film, and adjacent the emitter.

16 Claims, 8 Drawing Sheets

(56) References Cited

U.S. PATENT DOCUMENTS

| | | | |
|---|---|---|---|
| 2015/0194510 A1* | 7/2015 | Camillo-Castillo | ........................ H01L 29/66242 257/586 |
| 2015/0311283 A1* | 10/2015 | Adkisson | ............ H01L 29/0804 257/586 |
| 2015/0318384 A1* | 11/2015 | Boeck | ................. H01L 29/1004 257/586 |
| 2015/0349100 A1* | 12/2015 | Umemoto | .............. H01L 29/152 257/586 |
| 2015/0357446 A1* | 12/2015 | Tschumakow | .... H01L 21/02532 257/586 |
| 2016/0104770 A1* | 4/2016 | Camillo-Castillo | ........................ H01L 29/66242 257/586 |
| 2016/0380067 A1* | 12/2016 | Camillo-Castillo | ........................ H01L 29/66242 257/586 |

* cited by examiner

BIPOLAR TRANSISTOR WITH ELEVATED EXTRINSIC BASE AND METHODS TO FORM SAME

STATEMENT REGARDING FEDERAL RIGHTS

This invention was made with government support under DARPA 45SG01 DARPA T-Music Agreement No. HR0011-20-3-0002 awarded by the United States Defense Advanced Research Project Agency (DARPA). The government has certain rights in the invention.

TECHNICAL FIELD

Embodiments of the disclosure relate generally to integrated circuit (IC) structures. More specifically, various embodiments of the disclosure provide a bipolar transistor having an elevated extrinsic base, and related methods.

BACKGROUND

In the microelectronics industry as well as in other industries involving construction of microscopic structures, there is a continued desire to reduce the size of structural features and microelectronic devices and/or to provide a greater amount of circuitry for a given chip size. One type of transistor architecture is the bipolar junction transistor (BJT). A BJT refers to a transistor formed of three adjacent semiconductor regions (respectively known as emitter, base, and collector) with alternating conductivity types (e.g., N-P-N or P-N-P). Conventional approaches to form a BJT on a semiconductor substrate form an extrinsic base on an intrinsic base via conventional epitaxy. Such an approach may cause unacceptably rough surface topography on the top of the extrinsic base in small scale BJTs. Rough surface topography may be associated with subsequent processing and/or performance drawbacks.

SUMMARY

Aspects of the present disclosure provide a bipolar transistor structure, including: a collector on a substrate; a base film on the collector, wherein the base film includes a crystalline region on the collector and a non-crystalline region adjacent the crystalline region; an emitter on a first portion of the crystalline region of the base film; and an elevated extrinsic base on a second portion of the crystalline region of the base film, wherein the elevated extrinsic base is adjacent the emitter.

Further aspects of the present disclosure provide an integrated circuit (IC) structure, including: a bipolar transistor stack on a substrate, the bipolar transistor stack including: a collector, a base film on the collector, wherein the base film includes a crystalline region on the collector and a non-crystalline region adjacent the crystalline region, and an emitter on a first portion of the crystalline region of the base film; an elevated extrinsic base on a second portion of the crystalline region of the base film, wherein the elevated extrinsic base is adjacent the emitter; and a trench isolation (TI) adjacent the collector and beneath the non-crystalline region of the base film, wherein a boundary between the collector and the TI is continuous with a boundary between the crystalline region of the base film and the non-crystalline region of the base film.

Yet another aspect of the present disclosure provides a method of forming an integrated circuit (IC) structure, the method including: forming a bipolar transistor stack within a substrate, the bipolar transistor stack including: a collector, a base film on the collector, wherein the base film includes a crystalline region on the collector and a non-crystalline region adjacent the crystalline region, and an emitter on a first portion of the crystalline region of the base film; and forming an elevated extrinsic base on a second portion of the crystalline region of the base film, wherein the elevated extrinsic base is adjacent the emitter.

BRIEF DESCRIPTION OF THE DRAWINGS

These and other features of this disclosure will be more readily understood from the detailed description of the various aspects of the disclosure taken in conjunction with the accompanying drawings that depict various embodiments of the disclosure, in which.

Figure 1:
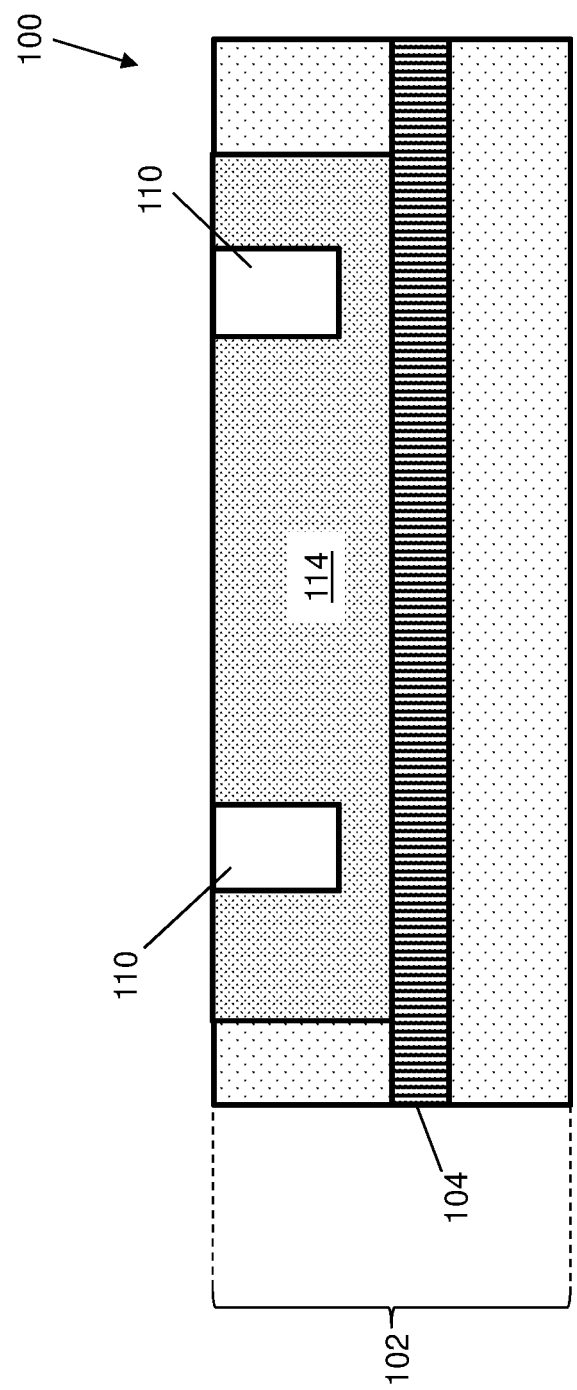
FIG. 1 provides a cross-sectional view of an initial structure to be processed according to embodiments of the disclosure.

It is noted that the drawings of the disclosure are not necessarily to scale. The drawings are intended to depict typical aspects of the disclosure, and therefore should not be considered as limiting the scope of the disclosure. In the drawings, like numbering represents like elements between the drawings.

DETAILED DESCRIPTION

In the description herein, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made within the scope of the present teachings. The description herein is, therefore, merely illustrative.

Embodiments of the disclosure provide an integrated circuit (IC) having a bipolar transistor with an elevated extrinsic base. The elevated extrinsic base may be formed exclusively on the crystalline region(s) of the base, e.g., by selective epitaxy. The elevated extrinsic base thus is not formed on any non-crystalline regions of an existing film of base material. The bipolar transistor may include a bipolar junction transistor (BJT) stack configured to include, e.g., a NPN, PNP, heterojunction (HBT) NPN, or HBT PNP configuration. Such a structure may include a bipolar transistor stack within a substrate. The bipolar transistor stack includes a collector, a base on the collector, and an emitter on a first portion of the base. Embodiments of the disclosure are distinct from BJT stacks, by forming extrinsic base materials only on crystalline base materials instead of all exposed portions of a base. The crystalline base materials may refer to semiconductor materials grown epitaxially on semiconductor, and not on insulative material such as trench isolation (TI) structures.

BJT structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction) but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials. IC structures according to the disclosure include an extrinsic base (e.g., formed of crystalline silicon and/or other semiconductor materials) on crystalline portions of the base in a BJT stack, such that non-crystalline portions of the base do not include extrinsic base material thereon. Dopants such as boron (B), and/or other p-type materials, may be formed on and/or introduced into the extrinsic base and non-crystalline region of the base. These dopants may not enter, and thus affect, the crystalline regions of the base below the extrinsic base. These structural characteristics may provide, among other things, improved operational reliability, and easier integration of vertical BJTs into an IC layout.

Referring to FIG. 1, a preliminary structure 100 (simply "structure" hereafter) suitable to form an IC structure according to embodiments of the disclosure is shown. Preliminary structure 100 may be processed as described herein to yield one or more vertical BJT structures with an extrinsic base on crystalline material. However, it is understood that other techniques, ordering of processes, etc., may be implemented to yield the same BJT structure(s) or similar BJT structures in further embodiments. FIG. 1 shows a cross-sectional view of structure 100 with a substrate 102 including, e.g., one or more semiconductor materials. Substrate 102 may include but is not limited to silicon, germanium, silicon germanium, silicon carbide, or any other common IC semiconductor substrates. A portion or entire semiconductor substrate 102 may be strained. The entirety of substrate 102 or a portion thereof may be strained.

Substrate 102 optionally may include embedded elements for electrically separating active materials formed thereon from other regions and/or materials within substrate 102. A resistive region 104 optionally may be formed within substrate 102, e.g., by converting silicon material within substrate 102 into a higher-resistive material such as polycrystalline or amorphous silicon (poly-Si). Resistive region 104 may extend horizontally throughout substrate 102, and/or may be formed selectively under locations where active materials are formed, examples of which are discussed elsewhere herein. In further implementations, resistive region 104 may include oxygen doping to form a dielectric insulator or a buried oxide ("BOX") layer underneath substrate 102 and electrically isolate overlying active semiconductor materials. In further implementations, resistive region 104 may include other elements or molecules such as Ge, N, or Si. However embodied, resistive region 104 may be sized as narrow as possible to provide better interaction with overlying semiconductor materials, and in various embodiments may have a thickness that is at most approximately twenty-five nanometers (nm) to approximately five-hundred nm. Some portions of substrate 102 may not have resistive region 104, and/or multiple resistive regions 104 may be formed within substrate 102 at different depths. Additionally, various conductive particles ("dopants") may be introduced into substrate 102 via a process known as "pre-doping" of substrate 102 above resistive region 104.

Embodiments of the disclosure may include forming a set of trench isolations (TIs) 110 by forming and filling trenches (not shown) with an insulating material such as oxide, to isolate one region of substrate 102 from an adjacent region of substrate 102. Various portions of an IC structure, including the active semiconductor materials of a BJT and/or other devices where applicable, may be disposed within an area of substrate 102 that is isolated by TI(s) 110. According to one example, two TIs 110 are formed, with one portion of substrate 102 being horizontally between the two TIs 110. This portion of substrate 102 may be processed to form the doped regions of a BJT, while other portions of substrate 102 may be doped and/or otherwise processed to form a conductive coupling to one terminal of the BJT structure. TIs 110 may be formed before active materials are formed within substrate 102, but this is not necessarily true in all implementations. Each TI 110 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

In some implementations, selected portions of substrate 102 may be doped to form a doped semiconductor region 114. Such portions of substrate 102 may be alongside and underneath TI(s) 110 to provide a pathway to other doped semiconductor materials. Thus, forming doped semiconductor region 114 may prepare substrate 102 for the forming of active semiconductor materials in a BJT stack. The initial doping of substrate 102 to form doped semiconductor region 114 may be P-type or N-type in a relatively low concentration, compared to subsequently formed doped materials. P-type dopants refer to elements introduced into substrate 102 to generate free holes by "accepting" electrons from a semiconductor atom and consequently "releasing" the hole. The acceptor atom must have one valence electron less than the host semiconductor. P-type dopants suitable for use in substrate 102 may include but are not limited to: boron (B), indium (In) and gallium (Ga). Boron (B) is the most common acceptor in silicon technology. Further alternatives include indium and gallium (Ga). Gallium (Ga) features high diffusivity in silicon dioxide (SiO$_2$), and hence, the oxide cannot be used as a mask during Ga diffusion. N-type dopants are elements introduced into semiconductor materials to generate free electrons, e.g., by "donating" an electron to the semiconductor. N-type dopants must have one more valance electron than the semiconductor. Common N-type donors in silicon (Si) include, e.g., phosphorous (P), arsenic (As), and/or antimony (Sb).

Figure 2:
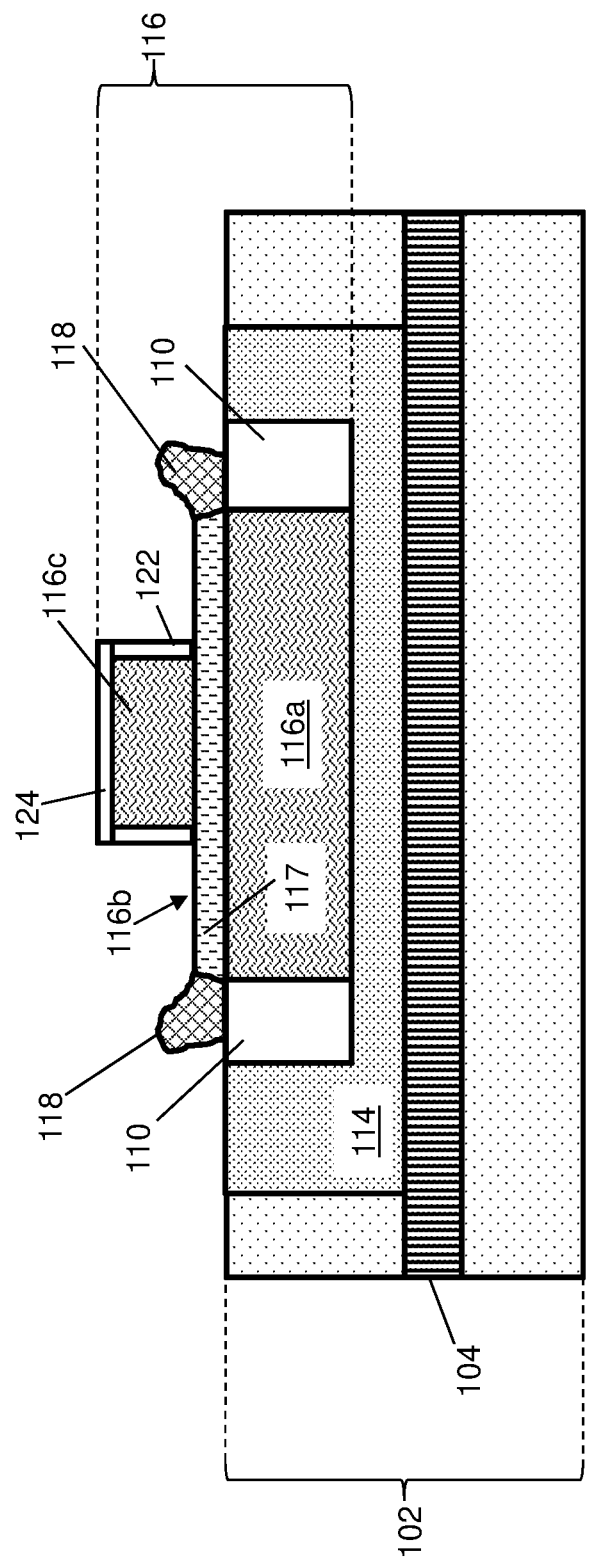
FIG. 2 provides a cross-sectional view of forming a base film and emitter on the structure according to embodiments of the disclosure.

Referring to FIG. 2, embodiments of the disclosure include selectively forming additional doped semiconductor materials suitable to form junctions for a bipolar transistor, and thus the active regions of a vertical BJT. Continued processing thus may include forming a BJT stack 116 on and/or from doped semiconductor region 114 (FIG. 1). Each layer of BJT stack 116 may be formed, e.g., by deposition and/or epitaxial growth of silicon germanium (SiGe), or one or more compound semiconductor materials (e.g., gallium arsenide (GaAs), aluminum gallium arsenide (AlGaAs), silicon carbide (SiC), gallium nitride (GaN), and/or other compound materials with similar properties. Each of these various semiconductor or compound semiconductor materials may be formed as a single layer or film. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The forming of BJT stack 116 may be implemented by direct doping of doped semiconductor region 114 (FIG. 1), and/or by removing portions of doped semiconductor region 114 between TI(s) 110 and forming new semiconductor materials therein. Such materials may be formed by at least partially selective deposition of silicon germanium (SiGe), compound semiconductor materials, and/or other materials, optionally with a mask, pad nitride, and/or other blocking structure (not shown) in place over other portions of substrate 102 to prevent the forming of active semiconductor material thereon. BJT stack 116 may include a collector 116*a*, which may be doped N-type or P-type and more specifically may have the same polarity as doped semiconductor region 114 thereunder. Collector 116*a* may have distinct dopants and/or doping concentrations relative to doped semiconductor region 114, and may be doped in situ during its deposition and growth, where applicable.

Next, a base film 116*b* of BJT stack 116 may be formed on collector 116*a*, e.g., by at least partially selective deposition and etching on collector 116*a*. Base film 116*b* may also be formed of SiGe, compound semiconductor materials, etc., and may have an opposite doping type with respect to collector 116*a*, e.g., by being P-type when collector 116*a* is N-type, or vice versa. In base film 116*b*, the Ge concentration may be controlled to suit particular applications, and base film 116*b* may have a Ge concentration of, e.g., between approximately five percent and approximately fifty percent. In further implementations, base film 116*b* may include any currently known or later developed compound semiconductor material, e.g., GaAs, AlGaAs, SiC, GaN, etc. As with collector 116*a*, base film 116*b* may be doped in situ to any desired concentration. Base film 116*b* may have a horizontal width that is greater than collector 116*a* thereunder, e.g., due to being formed partially on TI(s) 110 adjacent collector 116*a*. As base film 116*b* is formed, semiconductor material may be formed indiscriminately on collector 116*a* and other materials adjacent collector 116*a*, thereby completely covering the underling materials. Thereafter, portions of base film 116*b* not located on collector 116*a* and/or TI(s) 110 may be removed, e.g., by masking and etching base film 116*b* such that it remains only over collector 116*a*, and partially over TI(s) 110. Forming base film 116*b* in this manner causes some portions of base film 116*b* to have a crystalline composition, while other portions of base film 116*b* may be partially crystalline or non-crystalline. Forming base film 116*b* by epitaxy and/or similar processes for growth of semiconductor material may cause base film 116*b* to include a crystalline region 117 on collector 116*a*, due to replicating the crystallographic orientation of semiconductor materials in collector 116*a*. However, the same deposition and/or epitaxial growth may cause any semiconductor material(s) formed on TI(s) 110 to be non-crystalline. Thus, base film 116*b* may include one or more non-crystalline regions 118 on TI(s) 110. The differences in crystallographic configuration between crystalline region 117 and non-crystalline region 118 may cause non-crystalline region 118 to have a greater height above substrate 102 than crystalline region 117. Notwithstanding these differences in crystallographic structure, crystalline region 117 and non-crystalline region 118 each may be considered to be portions of base film 116*b*.

An emitter 116*c* may be formed on a portion of base film 116*b* by deposition and/or epitaxial growth, and emitter 116*c* may have the same doping type as collector 116*a* of BJT stack 116. Emitter 116*c* may include any material capable of being included within collector 116*a* and/or other semiconductive materials, e.g., SiGe, compound semiconductor materials, and/or other materials with similar properties. Emitter 116*c* may be doped to any desired concentration. In some cases, emitter 116*c* may have a similar doping concentration as collector 116*a*. The emitter 116*c* material may be doped in situ during epitaxial growth or may be doped after the emitter material is deposited. Some portions of emitter 116*c* may be removed, e.g., through controlled epitaxial growth on base film 116*b* and/or using masks. Here, the width of emitter 116*c* is less than the width of base film 116*b*. Together, collector 116*a*, base film 116*b*, and emitter 116*c* may form alternating P-N junctions because of their forming and doping, and thus define the three active terminals of a vertical BJT.

Continued processing may include forming a set of spacers 122 on sidewalls of emitter 116*c*, and/or a spacer liner 124 on an upper surface of emitter 116*c*. Spacers 122 may be distinguished from spacer liner 124 solely based on their position relative to emitter 116*c*. That is, spacers 122 may be formed on the side of emitter 116*c* while spacer liner 124 is formed on the upper surface of emitter 116*c*. Spacers 122 and/or spacer liner 124 may be formed, e.g., by conformal deposition and etching on exposed surfaces of emitter 116*c*. Spacer 122 and/or spacer liner 124 may be formed of a nitride insulator and/or other insulator materials described elsewhere herein with respect to TI(s) 110 and/or other insulative materials. Spacers 122 and/or spacer liner 124 also may be formed, e.g., on substrate 102, TI(s) 110, and/or on portions of base film 116*b*. The portions of spacers 122 and/or spacer liners 124 formed on structures other than emitter 116*c* may be removed by vertical etching and, hence, are not shown in FIG. 2. Such vertical etching may be implemented with a mask (not shown) over emitter 116*c* to prevent removing of spacers 122 and/or spacer liner 124 from emitter 116c. Spacer(s) 122, once formed, electrically separates emitter 116c from other materials formed on base film 116b.

Figure 3:
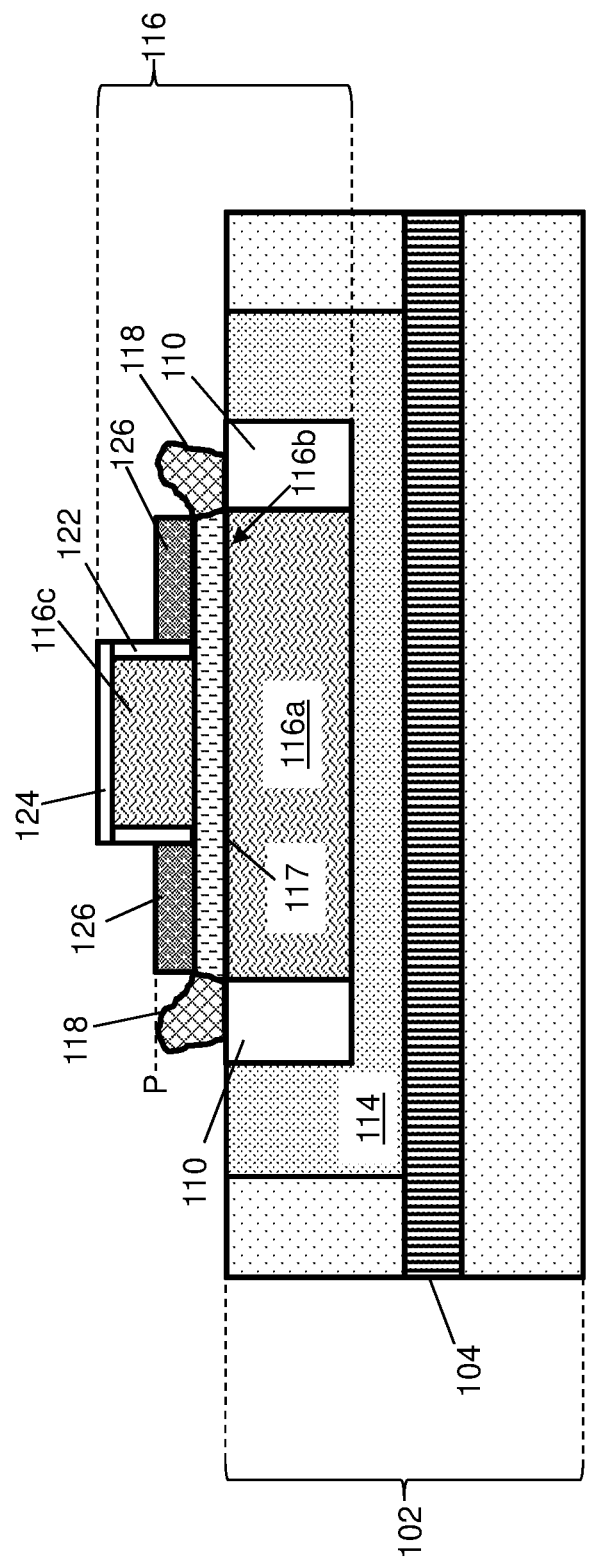
FIG. 3 provides a cross-sectional view of forming an elevated extrinsic base on a crystalline region of the base film according to embodiments of the disclosure.

Referring to FIG. 3, embodiments of the disclosure include forming at least one elevated extrinsic base 126 on crystalline region 117 of base film 116b. Elevated extrinsic base(s) 126 may be formed as a single layer, e.g., by at least partially selective epitaxial growth on crystalline region 117. Multiple layers of elevated extrinsic base(s) 126 may be formed on top of each other in some implementations, and elevated extrinsic base(s) 126 additionally or alternatively may be formed as a pair on opposite sides of emitter 116c. Elevated extrinsic base(s) 126 may include, e.g., epitaxially grown crystalline silicon germanium (SiGe). Elevated extrinsic base(s) 126 may be of the same doping type as base film 116b (e.g., P-type or N-type depending on whether an NPN or PNP configuration is used). The epitaxially grown elevated extrinsic base(s) 126 may have a Ge concentration that is different (e.g., significantly higher or lower percentage) than that of base film 116b. For instance, when base film 116b is approximately ten percent Ge, elevated extrinsic base(s) 126 may have at least a twenty percent Ge concentration, or in some cases may not have any Ge. Thus, elevated extrinsic base(s) 126 may have a distinct Ge concentration and electrical conductivity relative to base film 116b. In cases where base film 116b is formed of a compound semiconductor (e.g., Ge, As, AlGaAs, SiC, GaN, etc., as described herein), elevated extrinsic base(s) 126 simply may have a composition that is different from base film 116b thereunder. In such cases, elevated extrinsic base(s) 126 may include Si, Ge, and/or other materials.

The forming of elevated extrinsic base(s) 126 may be highly selective, such that elevated extrinsic base(s) 126 will grow on, and/or extend vertically upward from, crystalline region 117 within the perimeter of base film 116b. Epitaxy refers to a process by which crystalline material is grown on existing crystalline materials (e.g., crystalline substrate). In epitaxy, growth occurs in such a way that crystallographic structure of the existing material (including defects, where applicable) is reproduced in the newly grown material. Selective epitaxy refers to a type of epitaxial in which new material is grown only on exposed Si or SiGe, and no material is grown on exposed dielectric (e.g., silicon oxide or nitride). For instance, in the case of a crystalline semiconductor that is partially covered with oxide, or a crystalline material (e.g., base film 116b) adjacent a non-crystalline material (e.g., TI(s) 110), newly grown semiconductor material will solely or predominantly on the existing crystalline material, while non-crystalline material will form solely or predominantly on the existing non-crystalline material, and no material with grow on the dielectric material. By contrast, non-selective epitaxy refers to a type of epitaxial growth where new material grows on all exposed surfaces, and the resulting new material is single crystal in those regions where a single crystal Si or SiGe is exposed, and is poly-crystalline on those regions where poly-crystalline or dielectric material is exposed. Those skilled in the art will be familiar with the properties of the epitaxial growth that govern the relative process selectivity, including, e.g., applied temperature and pressure, the mixture of growth precursor (e.g. SiH4 or GeH4) vs. etchant precursor (e.g. HCl or Cl2), the composition of the epitaxial growth, and the types of seed material(s) and dielectric materials. These parameters govern the relative growth rate (or lack thereof) on crystalline vs. dielectric material, but they also govern the crystal-plane dependent growth rate on a crystalline material, as well as the relative growth rate on single crystal material versus poly-crystalline material in the case that the substrate includes both single crystal and poly-crystalline seed materials. Regardless of the amount of selectivity, the boundary between TI 110 and base film 116b may at least partially define a boundary between crystalline and poly-crystalline or non-crystalline materials formed thereon by partially selective epitaxial growth. In the case of highly selective epitaxy, the elevated extrinsic base(s) 126 may not form on non-crystalline region(s) 118 of base film 116b while the elevated extrinsic base 126 is formed on crystalline region(s) 117. Thus, elevated extrinsic base(s) 126 may have a width that is less than the total width of base film 116b thereunder. Additionally, spacer(s) 122 may horizontally separate elevated extrinsic base(s) 126 from emitter 116c.

Doping of elevated extrinsic base(s) 126 may not occur until the subsequent forming materials on elevated extrinsic base 126. Elevated extrinsic base(s) 126, furthermore, may have a different material composition from other portions of BJT stack 116, in addition to having different crystallographic features and/or orientation. Due to the greater height of non-crystalline region 118 above substrate 102 relative to crystalline region 107, elevated extrinsic base 126 may be horizontally adjacent portions of non-crystalline region 118. The horizontal interface between elevated extrinsic base 126 and non-crystalline region 118 may be substantially continuous with the horizontal interface between TI 110 and collector 116a (as indicated by line S (FIG. 4)). This continuity may arise from forming elevated extrinsic base 126 selectively on collector 116a. In cases where the junction between non-crystalline region 118 and extrinsic base 126 is substantially linear or otherwise oriented along a vertical axis, this junction may be substantially aligned with the junction between TI 110 and collector 116a (e.g., along line S). While elevated extrinsic base(s) 126, can also be doped during growth (in-situ), the doping levels that may be limited by process capability. Such limitations on doping may negatively affect device performance if elevated extrinsic base(s) 126 is not further processed. Such concerns may be overcome, e.g., through additional doping of elevated extrinsic base 126 material as discussed herein.

Figure 4:
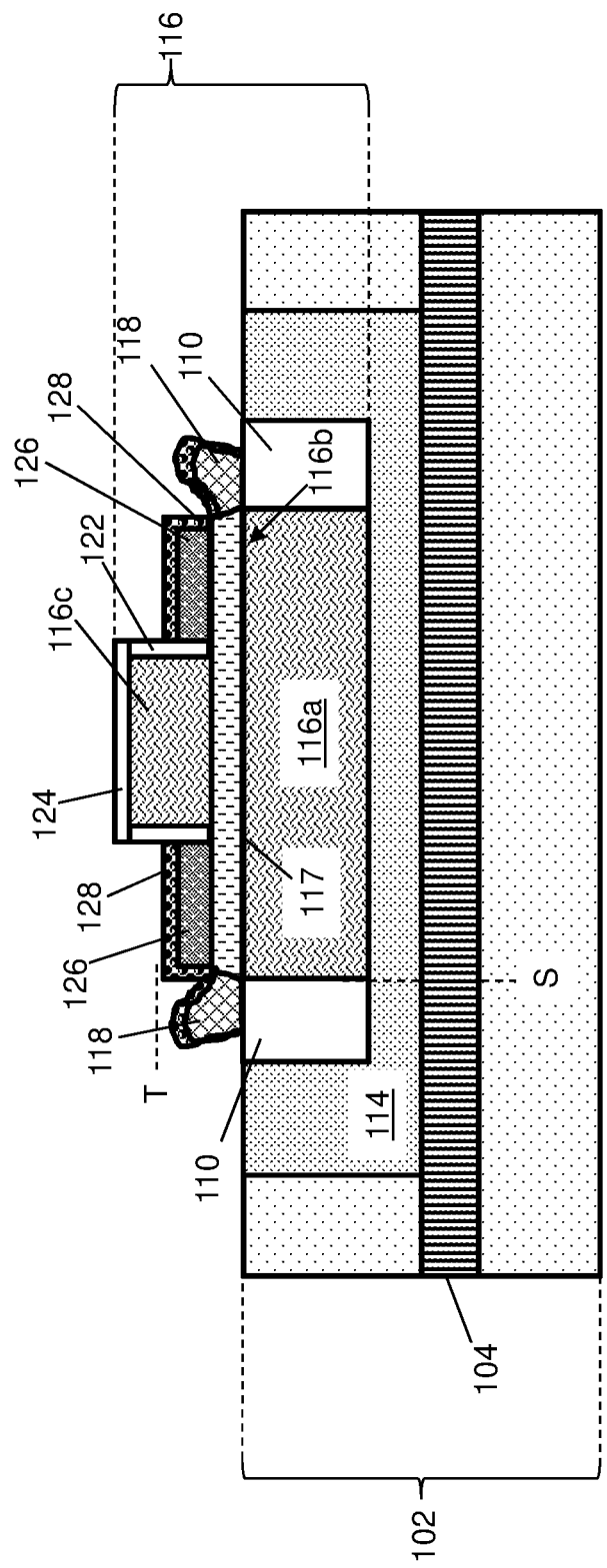
FIG. 4 provides a cross-sectional view of doping the elevated extrinsic base and non-crystalline region of the base film according to embodiments of the disclosure.

FIG. 4 depicts continued processing to affect the electrical conductivity of base film 116b and elevated extrinsic base 126, e.g., to increase electrical conductivity to BJT stack 116 through these components. Methods according to the disclosure may include introducing dopants into elevated extrinsic base 126 and nearby portions of base film 116b to a desired depth. The doping of elevated extrinsic base 126 and adjacent portions of non-crystalline region 118 may include forming an ion layer 128 on or within exposed portions of non-crystalline region 118 and/or elevated extrinsic base 126. It has been determined that shallow ion doping of non-crystalline region 118 and elevated extrinsic base 126, i.e., doping to a depth above crystalline region 117, prevents these dopants from migrating into opposite polarity portions of BJT stack 116 (e.g., into collector 116a where they are not desired). Example techniques suitable to form ion layer 128 include, e.g., shallow implantation, plasma doping, gas phase doping, and/or other techniques suitable to form ion layer 128 on targeted surfaces (e.g., those not covered by spacer(s) 122 and/or spacer liner 124). In a more specific example, methods of the disclosure may include forming ion layer 128 of boron (B) and/or other dopants (e.g., p-type materials) capable of gas deposition. Additionally, the forming of ion layer 128 may partially planarize any non-planar surfaces, e.g., by partially filling empty space at the interface between non-crystalline region 118 and elevated extrinsic base 126.

Figure 5:
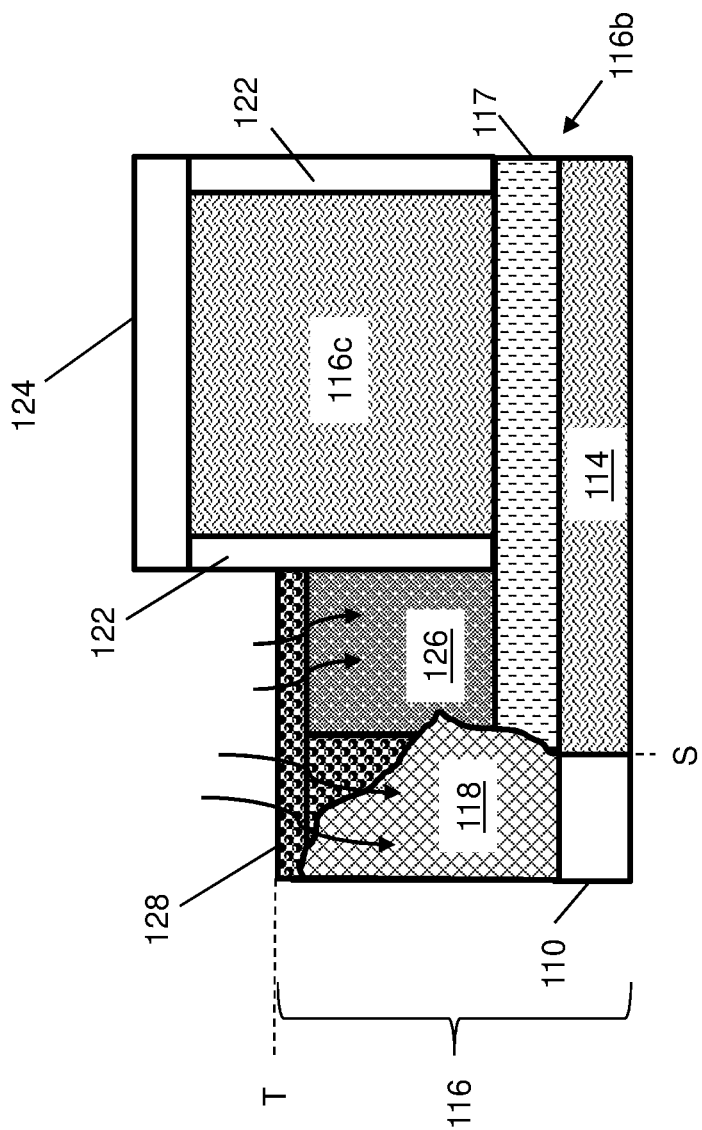
FIG. 5 provides an expanded cross-sectional view of diffusing the dopant layer into the elevated extrinsic base and non-crystalline portion of the base film according to embodiments of the disclosure.
Figure 6:
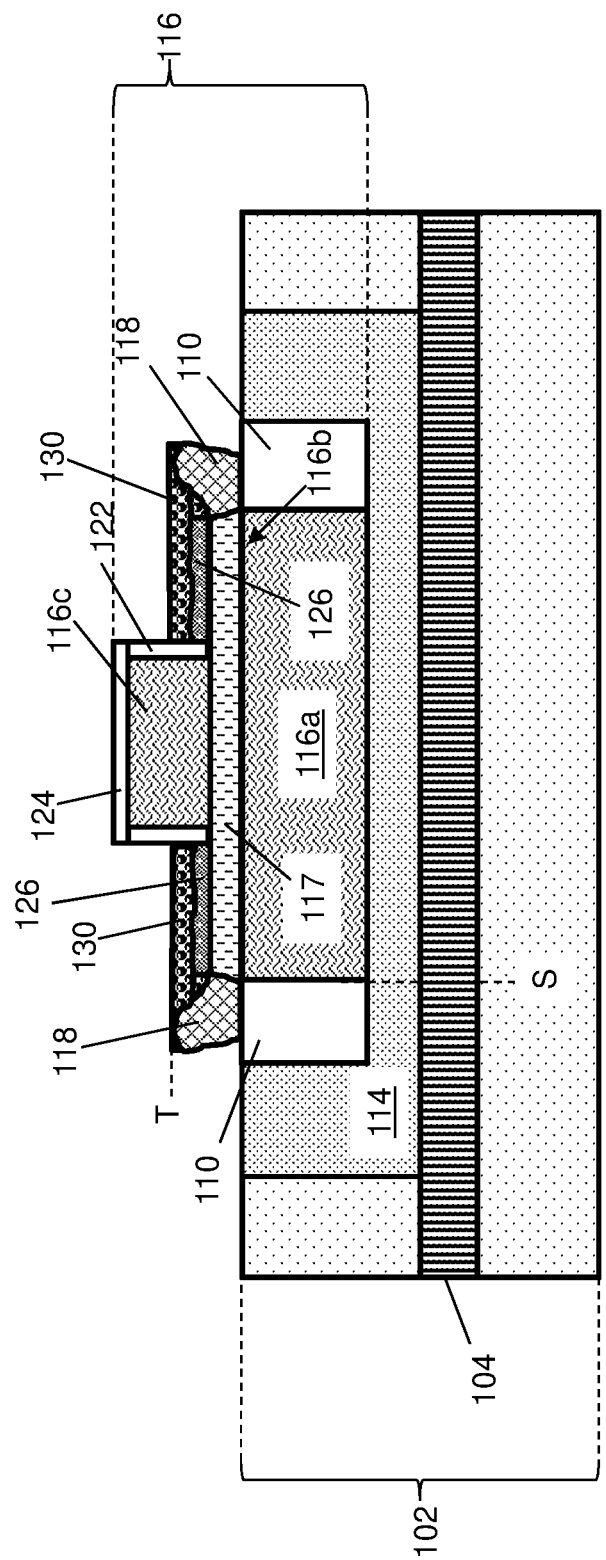
FIG. 6 provides a cross-sectional view of the structure after diffusing dopants into the elevated extrinsic base and non-crystalline region of the base film according to embodiments of the disclosure.
Figure 7:
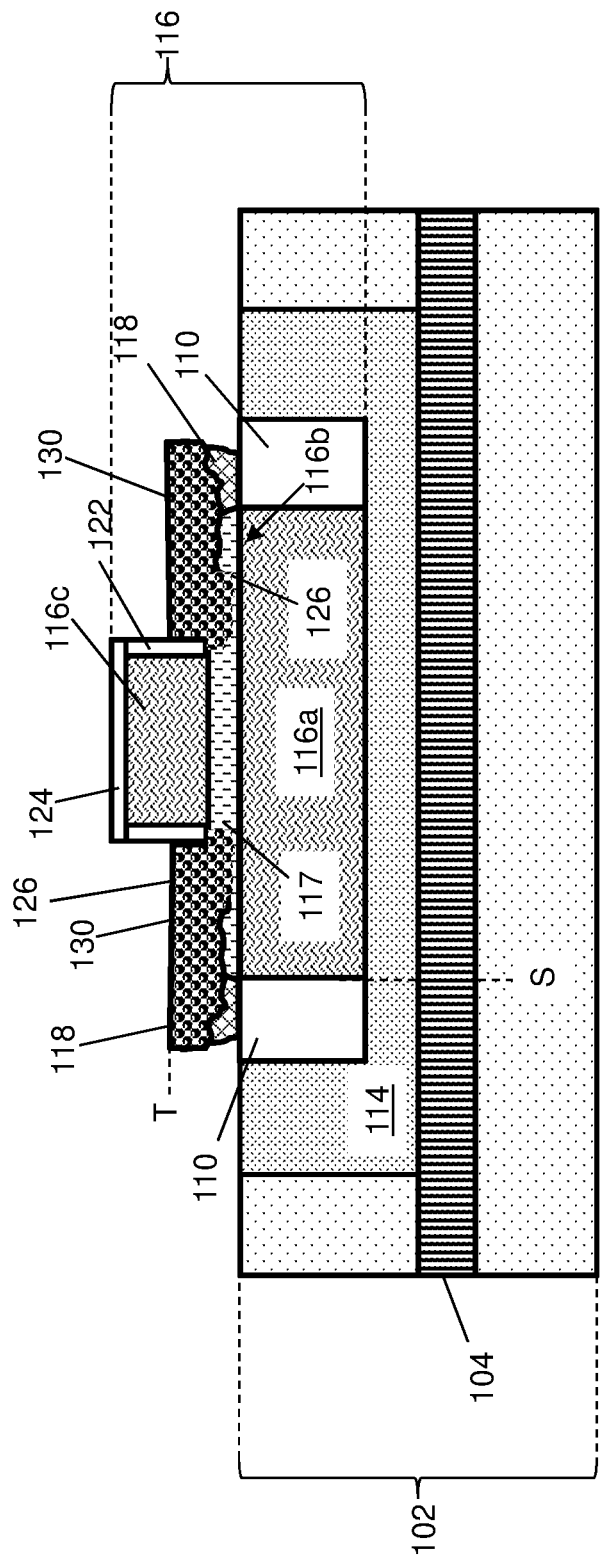
FIG. 7 depicts an alternative embodiment of the structure after diffusing dopants into the elevated extrinsic base and non-crystalline region of the base film.

Referring to FIGS. 5-7 together, embodiments of the disclosure may include causing dopant materials (e.g., boron or other p-type materials) to migrate from ion layer 128 into underlying materials to yield a doped region 130 (FIG. 6). FIG. 5 provides an expanded view of non-crystalline region 118, elevated extrinsic base 126, and doped region 130. Although ion layer 128 (FIG. 4) initially may be formed on exposed portions non-crystalline region 118 and elevated extrinsic base 126, subsequent processing may include causing materials within ion layer 128 to migrate into underlying materials, e.g., by way of diffusion. An example methodology to drive dopants from ion layer 128 into underlying materials may include, e.g., annealing or other types of heat treatment. Any conceivable annealing process to drive-in dopants from ion layer 128 may be performed, e.g., a rapid thermal anneal (RTA), to enable doping of non-non-crystalline region 118 and elevated extrinsic base 126. In this example, dopants can migrate downward into underlying materials, e.g., along the pathways shown by arrows in FIG. 5. At this stage, dopant-containing regions of non-crystalline region 118 and elevated extrinsic base 126 define doped region 130 (FIG. 6 only). In a further example illustrated in FIG. 7, the migration of dopants may pass through elevated extrinsic base 126 to reach portions of base film 116b thereunder. Although the stronger dopant migration in FIG. 7 to produce doped regions 130 of greater size may be desirable, this is not necessary in all implementations.

The combination of shallow doping and subsequent dopant migration additionally can coat, and in some cases remove, any of the dimensional features that would otherwise be present on non-crystalline region 118 and elevated extrinsic base 126. For example, an upper surface of doped region 130 in non-crystalline region 118 and elevated extrinsic base 126 can be substantially planar along line T. Furthermore, the horizontal interface between non-crystalline region 118 and elevated extrinsic base 126 may be substantially continuous with the horizontal interface between TI 110 and collector 116a (e.g., along line S), as described herein. Forming doped region 130 may increase electrical conductivity through doped region 130 to elevated extrinsic base 126 and portions of base film 116b thereunder, after subsequent contact formation. Additionally, forming doped region 130 may further planarize the upper surface of elevated extrinsic base(s) 126, and/or further reduce topographical differences between non-crystalline region 118 and elevated extrinsic base(s) 126.

Figure 8:
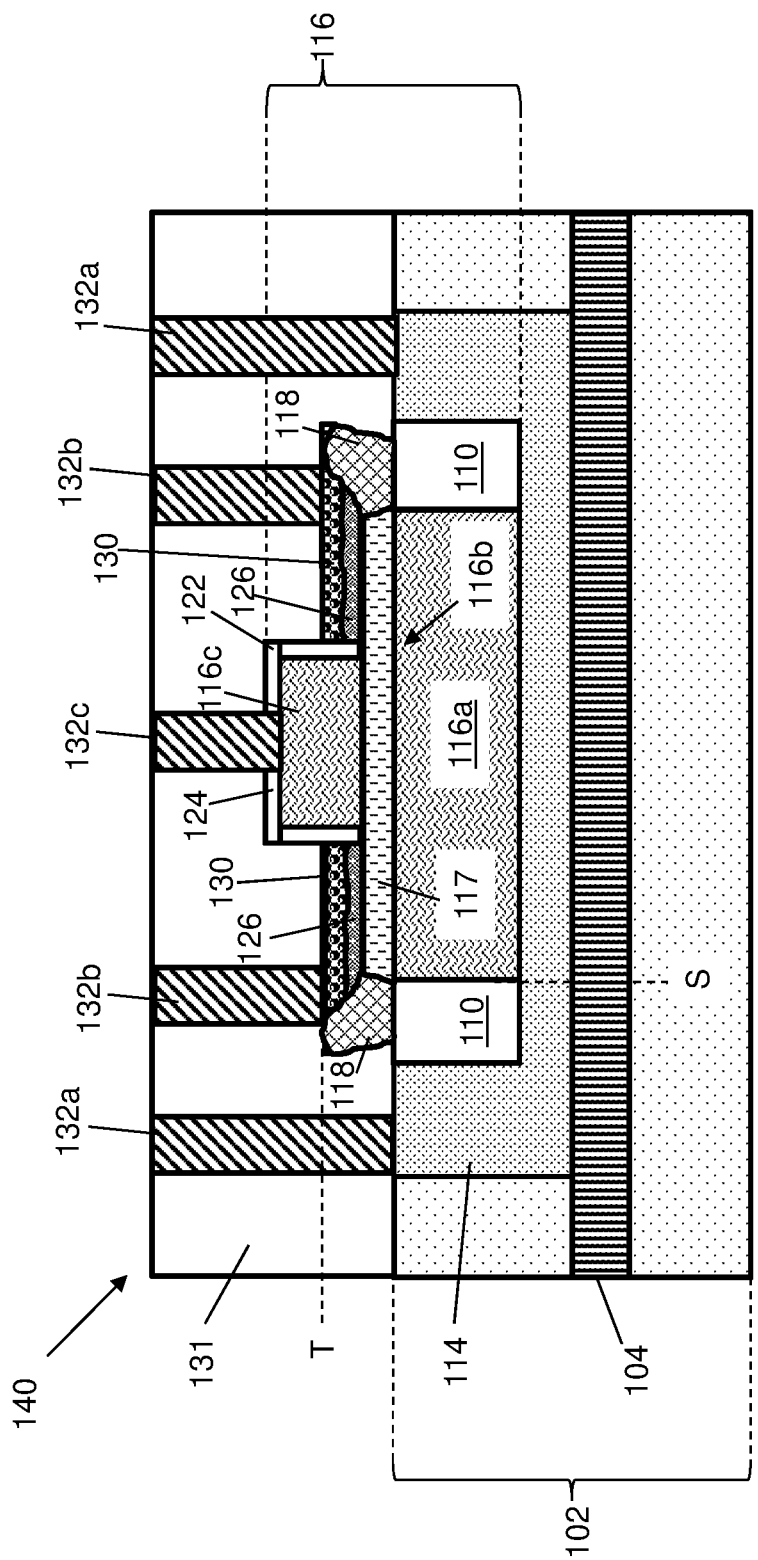
FIG. 8 provides a cross-sectional view of forming contacts to an IC structure according to embodiments of the disclosure.

FIG. 8 depicts the forming of an inter-level dielectric (ILD) layer 131 above substrate 102; including TI(s) 110, BJT stack 116, and doped region(s) 130 over non-crystalline region 118 and elevated extrinsic base 126. ILD layer 131 may be formed, e.g., by deposition or other techniques of forming an insulative material on a structure. ILD layer 131 may include the same insulating material as TI(s) 110, or may include a different electrically insulative material. ILD layer 131 and TI(s) 110 nonetheless constitute different components, e.g., due to TI(s) 110 being formed within portions of substrate 102 instead of being formed thereon. In further embodiments (not shown), a silicide layer as known in the art could be formed on the exposed surfaces of doped region(s) 130 prior to ILD layer 131 deposition. For example, a cobalt (Co), titanium (Ti), nickel (Ni), platinum (Pt), or similar self-aligned silicide (silicide) could be formed prior to ILD layer 131 deposition. Additional metallization layers (not shown) may be formed on ILD layer 131 during middle-of-line and/or back-end-of-line processing. To electrically couple various components discussed herein to such metallization layers, a collector contact 132a may be formed within ILD 131 to portions of substrate 102 that connect to collector 116a of BJT stack 116. At this stage, doped semiconductor region 114 within substrate 102 may electrically couple collector contact(s) 132a to collector 116a. Similarly, one or more base contacts 132b may be formed within ILD 131 for coupling to doped region(s) 130 and/or silicide materials therein. Portions of spacer liner 124 on the upper surface of emitter 116c may be removed by vertical etching (e.g., by RIE), and an emitter contact 132c within ILD 131 can be formed thereon. Other portions of spacer(s) 122 and/or spacer liner 124 may remain intact after emitter contact 132c is formed.

One or more of contacts 132a, 132b, 132c to overlying circuit elements may be formed within predetermined portions of ILD layer 131 by a controlled amount of vertical etching to form openings to one or more contact sites, and then filling the openings with a conductor. Each contact 132a, 132b, 132c may include any currently known or later developed conductive material configured for use in an electrical contact, e.g., copper (Cu), aluminum (Al), gold (Au), etc. Contacts 132a, 132b, 132c may additionally include refractory metal liners (not shown) positioned alongside ILD layer 131 to prevent electromigration degradation, shorting to other components, etc. Additionally, selected portions of substrate 102, doped semiconductor region 114, emitter 116c, and doped region(s) 130 may include silicide regions (i.e., portions of semiconductor that are annealed in the presence of an overlying conductor to increase the electrical conductivity of semiconductor regions) to increase the electrical conductivity at their physical interface with contact(s) 132a, 132b, 132c, where applicable.

Embodiments of the disclosure provide an IC structure 140, in which BJT stack 116 within substrate 102 has structural features that may arise from methods described herein and/or analogous techniques. BJT stack 116 may include collector 116a, base film 116b on collector 116a, and emitter 116c on a portion of base film 116b. Elevated extrinsic base 126 may be located on crystalline region 117 of base film 116b, adjacent emitter 116c. Spacer(s) 122 may be horizontally between elevated extrinsic base 126 and emitter 116c. The germanium concentration within upper elevated extrinsic base 126 may be different (i.e., significantly higher or lower percentage) than the germanium concentration of within base film 116b (including crystalline region 117), e.g., due to the multiple instances of deposition and/or epitaxial growth. Elevated extrinsic base 126 may be located only on crystalline region 117 (i.e., not above TI(s) 110, doped semiconductor region 114, and/or non-crystalline region 118) due to being formed by selective epitaxy on crystalline semiconductor material. Non-crystalline region 118 of base film 116b may be on TI 110 and adjacent crystalline region 117, e.g., by being grown epitaxially from portions of base film 116b. The upper surface of elevated extrinsic base 126 along doped region 130 may be substantially coplanar with the upper surface of non-crystalline region 118 along doped region 130, e.g., as indicated through line T. In this case, IC structure 140 is substantially free of topographical features (e.g., height differences) along the junction between base contact(s) 132c and doped region(s) 130 thereunder.

Embodiments of the disclosure provide various technical and commercial advantages. Some advantages of the disclosure may include, e.g., providing an elevated extrinsic base that is substantially planar along its upper surface, despite the presence of non-crystalline region 118 adjacent elevated extrinsic base 126. Embodiments of the disclosure substantially eliminate the presence of topographical features on base contacts to IC structure 140, thereby improving device performance and scalability. Such benefits may arise in part from selective epitaxial growth of elevated extrinsic base 126 on crystalline region 117 (e.g., without also being formed on non-crystalline region 118), as well as from shallow doping of non-crystalline region 118 and elevated extrinsic base 126 to yield doped region(s) 130 in each element.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A bipolar transistor structure, comprising:
   a collector on a substrate;
   a base film on the collector, wherein the base film includes a crystalline region on the collector and a non-crystalline region adjacent the crystalline region;
   an emitter on a first portion of the crystalline region of the base film; and
   an elevated extrinsic base on a second portion of the crystalline region of the base film, wherein the elevated extrinsic base is adjacent the emitter.

2. The bipolar transistor structure of claim 1, further comprising a trench isolation (TI) adjacent the collector and beneath the non-crystalline region of the base film.

3. The bipolar transistor structure of claim 1, wherein the elevated extrinsic base and the non-crystalline region of the base film include boron doping.

4. The bipolar transistor structure of claim 1, wherein the elevated extrinsic base includes crystalline silicon germanium (SiGe), and the elevated extrinsic base has a different germanium (Ge) concentration from the base film.

5. The bipolar transistor structure of claim 1, wherein the collector, the base film, and the emitter each include a compound semiconductor material, and wherein the elevated extrinsic base has a different material composition from the base film.

6. The bipolar transistor structure of claim 1, further comprising a spacer between the emitter and the elevated extrinsic base.

7. The bipolar transistor structure of claim 1, wherein an upper surface of the elevated extrinsic base is substantially coplanar with an upper surface of the non-crystalline region of the base film.

8. The bipolar transistor structure of claim 1, wherein an upper surface of the elevated extrinsic base is substantially planar.

9. An integrated circuit (IC) structure, comprising:
   a bipolar transistor stack on a substrate, the bipolar transistor stack including:
      a collector,
      a base film on the collector, wherein the base film includes a crystalline region on the collector and a non-crystalline region adjacent the crystalline region, and
      an emitter on a first portion of the crystalline region of the base film;
   an elevated extrinsic base on a second portion of the crystalline region of the base film, wherein the elevated extrinsic base is adjacent the emitter; and
   a trench isolation (TI) adjacent the collector and beneath the non-crystalline region of the base film, wherein a boundary between the collector and the TI is continuous with a boundary between the crystalline region of the base film and the non-crystalline region of the base film.

10. The IC structure of claim 9, wherein the elevated extrinsic base and the non-crystalline region of the base film include a p-type material.

11. The IC structure of claim 9, wherein the elevated extrinsic base includes crystalline silicon germanium (SiGe), and the elevated extrinsic base has a different germanium (Ge) concentration from the base film.

12. The IC structure of claim 9, wherein the collector, the base film, and the emitter include a compound semiconductor material, and wherein the elevated extrinsic base has a different material composition from the base film.

13. The IC structure of claim 9, further comprising a spacer between the emitter and the elevated extrinsic base.

14. The IC structure of claim 9, wherein an upper surface of the elevated extrinsic base is substantially coplanar with an upper surface of the non-crystalline region of the base film.

15. The IC structure of claim 9, wherein an upper surface of the elevated extrinsic base is substantially planar.

16. The IC structure of claim 9, wherein the elevated extrinsic base is one of a pair of elevated extrinsic bases on respective portions of the crystalline region of the base film, wherein the emitter is horizontally between the pair of elevated extrinsic bases.

\* \* \* \* \*